(12) United States Patent  
Huber

(10) Patent No.: US 6,466,485 B2  
(45) Date of Patent: Oct. 15, 2002

(54) VOLTAGE REGULATOR AND DATA PATH FOR A MEMORY DEVICE

(75) Inventor: Brian W. Huber, Allen, TX (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/792,536

(22) Filed: Feb. 23, 2001

(65) Prior Publication Data

US 2002/0048188 A1 Apr. 25, 2002

Related U.S. Application Data

(62) Division of application No. 09/654,099, filed on Aug. 31, 2000.

(51) Int. Cl.[7] ................................................. G11C 7/00
(52) U.S. Cl. .......................... 365/189.05; 365/230.06; 327/170
(58) Field of Search ..................... 365/189.05, 230.06, 365/189.11, 207, 226; 327/170, 530, 536, 537, 538

(56) References Cited

U.S. PATENT DOCUMENTS 4,975,598 A * 12/1990 Borkar ........................ 307/443
6,100,744 A * 8/2000 Yoon ........................... 327/390

\* cited by examiner

Primary Examiner—A. Zarabian
(74) Attorney, Agent, or Firm—Thorp Reed & Armstrong, LLP

(57) ABSTRACT

The present invention is directed to a method and apparatus for providing variable output drive capability to an output driver. One aspect of the present invention is related to a pre-driver or the like which provides variable output drive capability. The pre-driver is comprised of two paths each divided into output stages. A signal is generated in response to determining the relative strength of the n-channel and p-channel transistors in a subsequent output amplifier. The signal is then used to enable certain of the pre-driver output stages in each output path. Another aspect of the present invention is related to a method of correcting output skews in a subsequent amplification stage. Other aspects of the present invention relate to a portion of a data path, a memory device, and a computer system all having a pre-driver with pre-driver output transistors responsive to signals indicative of the strength of output drive transistors.

13 Claims, 5 Drawing Sheets

VOLTAGE REGULATOR AND DATA PATH FOR A MEMORY DEVICE

RELATED APPLICATION

This application is a division of application Ser. No. 09/654,099, filed Aug. 31, 2000

BACKGROUND

1. Field of the Invention

The present invention is directed to memory devices generally and, more particularly, to voltage regulators and data paths used in such devices.

2. Description of the Background

Solid state memory devices communicate with the outside world through input/output pads. Some pads may be connected to an address bus and are thus dedicated to receiving address information. Other pads may be connected to a command bus from which command signals are received while still other pads are connected to a data bus, on which data to be written into the memory is received or data read from the memory is output. In other types of devices, the pads may be connected to a single multiplexed bus which, at one point in time outputs address and command information and, at another point in time, outputs or receives data.

To enable pads to receive or send information, the information is transmitted in the form of ones and zeros. The "ones" and "zeros" are typically represented by two different voltage levels. For example, a voltage between two and five and one half volts may be considered to represent a high signal, or a "one", while a voltage level of between minus 0.3 volts and plus 0.8 volts may be considered to represent a low signal, or a "zero". The output pads must be capable of reliably producing voltages within the ranges designated as representing ones and zeroes in accordance with timing specifications set for the component.

Timing specifications are typically set by the consumers of the memory devices for particular applications. A timing specification would identify how long it may take for an output pad to change from a zero to a one, e.g. change from minus 0.3 volts to plus five volts, how abrupt the changes must be, etc. With access times for memory devices measured in nanoseconds, it is clear the design engineer is faced with quite a challenge to design electrical circuits which can change the voltage available at the output pads so quickly.

Output pads typically are serviced by a number of circuits such as circuits for buffering (holding) data, and drive circuits for driving the voltage on the pad to a voltage representative of data to be output. The drive circuit, in turn, is serviced by devices such as voltage generators and voltage regulators which provide the power needed by the output pad drivers. The voltage regulator is used to provide power, in the form of voltage for driving the gate of an output transistor ultimately servicing an output pad. Typically, voltage regulators supply that gate voltage (Vgate) to a number of drive transistors through a voltage bus.

When the gate voltage is heavily loaded, the Vgate level recovery may not be sufficiently quick. Prior art attempts at solving this problem apply a one-shot pulse to an enable Vgate line. However, because the path between Vgate and the enable Vgate line is through a p-channel transistor with its n-well biased to Vgate, there is a risk of forward biasing the drain of the p-channel to the n-well if the one-shot pulling the enable V-gate line towards system voltage ($V_{DD}$) is not timed properly across all process and device conditions. Additionally, if the one-shot timing is too weak under particular process and device conditions, then Vgate will droop, and the enable Vgate lines will not recover sufficiently quickly.

Another problem is experienced in the prior art when the memory device, and hence the voltage regulator, must go into a nap or a standby mode. In such modes, the Vgate regulator needs to go to a low power mode very quickly. In some prior art configurations, that is accomplished by reducing the bias voltage supplied to an amplifier within the voltage regulator. However, simply reducing the bias voltage may not reduce the power consumption of the voltage regulator sufficiently quickly.

Another problem is encountered because output transistors typically have an RC time constant associated therewith as a result of their loading. The RC time constant prevents the output transistor from reducing its drive sufficiently quickly. In the prior art, a pass gate is used to disconnect the RC so that the output transistor can respond more quickly. However, that approach leaves one side of the RC load floating. Due to n-plus junctions, the floating side can move to a back bias voltage. Should that occur, when the RC is reconnected to the transistor, the transistor would be turned on hard.

Other problems associated with the data path relate to the output slew of data pad drivers. In the prior art, output slew rates are improved by segmenting the output transistors into two main portions and delaying the switching of one of the portions. The delay is controlled by a circuit that makes a determination as to the strength of the p- and n-channel transistors and generates a two-bit binary code. In addition to setting the delay based on the two-bit code, a NAND gate is used to receive the two-bit signal which, in turn, enables a p-channel transistor to further enable two other p-channel transistors in the output pre-driver so that they could strengthen the high side out of the pre-driver for both the normal and delayed paths. However, various changes over process and device conditions can cause the output's timing characteristic to be skewed. Because the prior art solution enables only the addition of p-channel transistors in one of the two-bit code cases, the degrees of freedom to compensate for various types of skew are limited.

Thus, the need exists for a voltage regulator and data path with improved performance characteristics.

SUMMARY OF THE PRESENT INVENTION

One aspect of the present invention is directed to a method and apparatus of boosting the gate voltages for transistors controlling the voltage appearing on output pads of a solid state memory device, with the gate voltages being supplied by a voltage regulator through an output bus. The demand for gate voltage is periodically determined and, when the demand is high, each line of the bus may be momentarily connected to a voltage source. In addition, additional current is temporarily sourced to the output terminal of the voltage regulator.

Another aspect of the present invention is directed to a method and apparatus of producing a control pulse of an extended duration for use in the voltage regulator having its output terminal connected to a voltage bus, and with the voltage bus serving a plurality of output blocks through a plurality of output lines. A first logic gate receives a plurality of signals each representative of the voltage demand of one of the plurality of output blocks and produces a control pulse of a first duration. A plurality of delay circuits receives the control pulse and produces a plurality of delayed control pulses. A second logic gate receives the control pulse and the plurality of delayed control pulses and produces a control pulse of extended duration. The control pulse of extended duration may be used, for example, for temporarily sourcing additional current to an output terminal of the voltage regulator.

According to another aspect of the present invention, a method is disclosed of forcing a voltage regulator into a low power mode. The method involves increasing the rate at which a bias voltage is withdrawn from an amplifier in the voltage regulator. A node between a resistive and capacitive load connected to an output transistor of the voltage regulator is pulled to a predetermined voltage other than ground. By reducing the bias voltage, power consumption is rapidly diminished. Furthermore, by pulling the node to a predetermined voltage other than ground, the node is prevented from floating to a voltage which will turn the transistor on hard when reconnected.

Another aspect of the present invention is directed to a pre-driver or the like which provides variable output drive capability. The pre-driver is comprised of two paths each divided into output stages. A two-bit signal is generated in response to determining the relative strength of the n-channel and p-channel transistors in a subsequent output amplifier. The two-bit signal is then used to enable certain of the output stages in each of the output paths.

The present invention solves the problems encountered in prior art voltage regulators used in memory devices or other types of demanding applications. For example, the present invention insures that the power provided by the voltage regulator is adequate even under heavy load conditions. The present invention insures that the power consumption is quickly reduced when the device is put into a nap or standby mode while at the same time insuring that the device will properly power up when desired. The present invention also improves the performance of the data path. Those, and other advantages and benefits, will become apparent from the Description of the Preferred Embodiment hereinbelow.

BRIEF DESCRIPTION OF THE DRAWINGS

For the present invention to be easily understood and readily practiced, the present invention will now be described, for purposes of illustration and not limitation, in conjunction with the following figures wherein:

FIG. 6 illustrates an implementation for the output transistors of a data pre-driver or the like.

DESCRIPTION OF THE PREFERRED EMBODIMENTS

Figure 1:
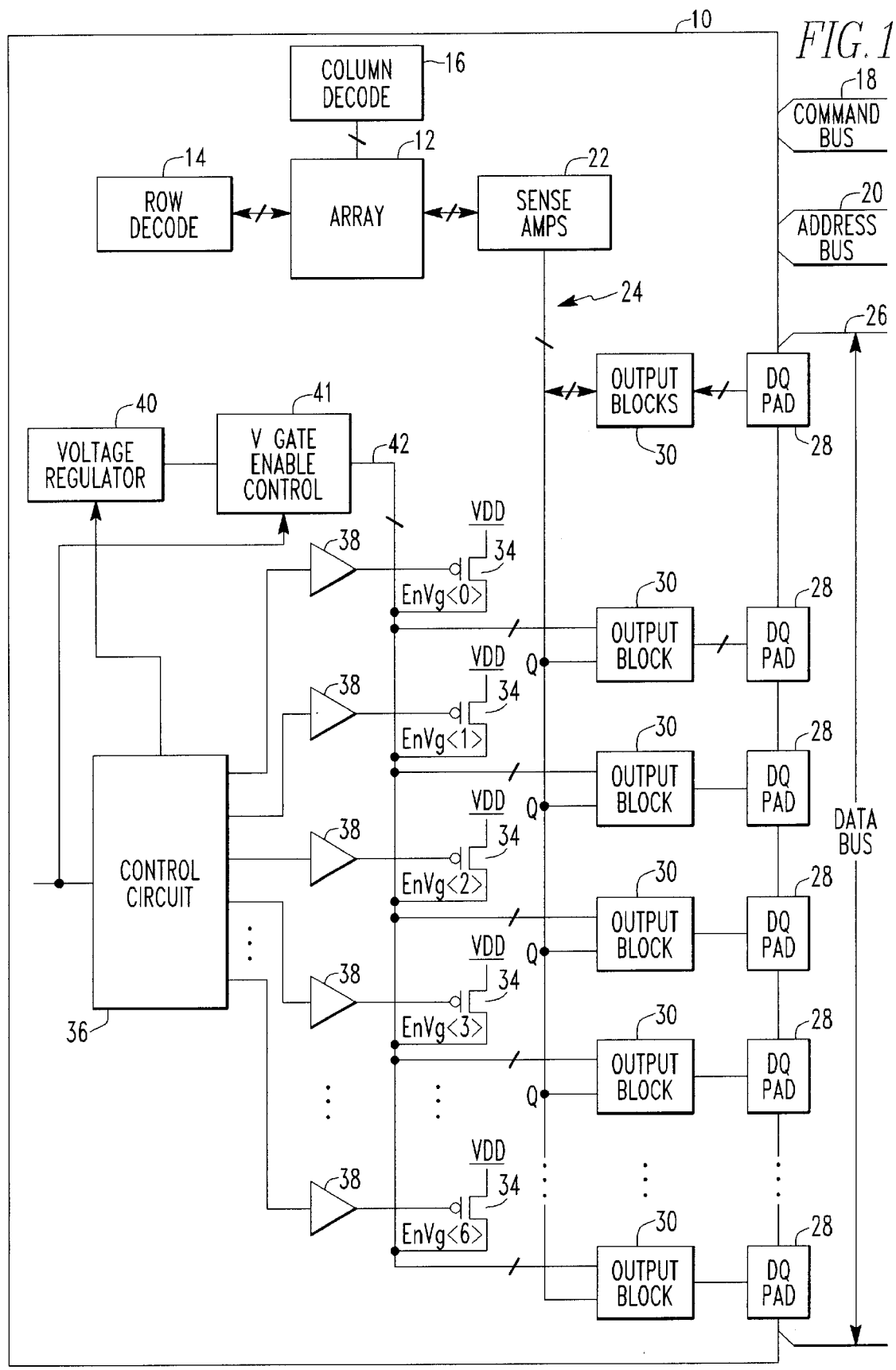
FIG. 1 is a block diagram of a memory device illustrating a voltage regulator servicing a number of output blocks.

The present invention will now be described in conjunction with FIG. 1 which illustrates a memory device 10. The reader will understand the description of the present invention in conjunction with the memory 10 of FIG. 1 is merely for purposes of providing one example of an application for the present invention. The present invention is not to be limited to the application shown in FIG. 1.

The memory device 10, includes an array 12 of memory cells. The memory cells 12 are arranged in rows and columns as is known in the art. Individual cells in the array 12 may be selected for a read or write operation by row decode circuitry 14 and column decode circuitry 16 which operates in response to command information on a command bus 18 and address information on an address bus 20. Signals appearing on the command bus 18 may include, but are not limited to, chip select, row address strobe, column address strobe, write enable and clock enable. Sense amps 22 read information out of and write information into cells which have been selected by row decode circuitry 14 and column decode circuitry 16 in response to read and write commands, respectively.

The sense amps 22 form part of a data path shown generally by reference numeral 24. The data path 24 is the path along which data flows between a data bus 26 and the array 12. For inbound data (data to be written into array 12), the data path begins at data pads 28 and ends with sense amps 22 writing the data into the array 12. For outbound data (data read from array 12), the path begins with the sense amps reading the data from the array 12 and ends with the data being output on the data pads 28.

Figure 2:
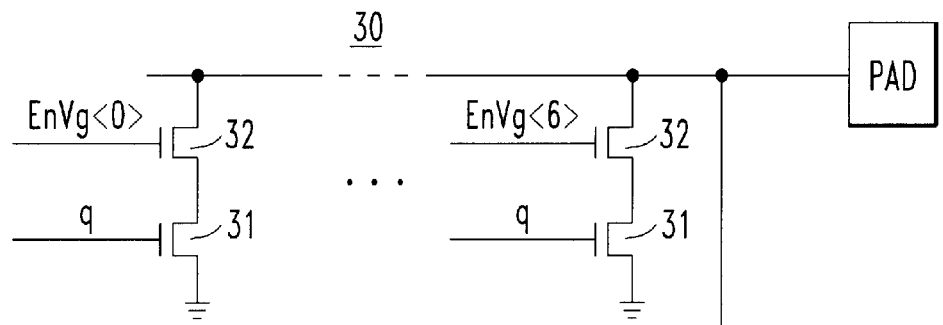
FIG. 2 is a circuit diagram of an output block of FIG. 1.
Figure 2:
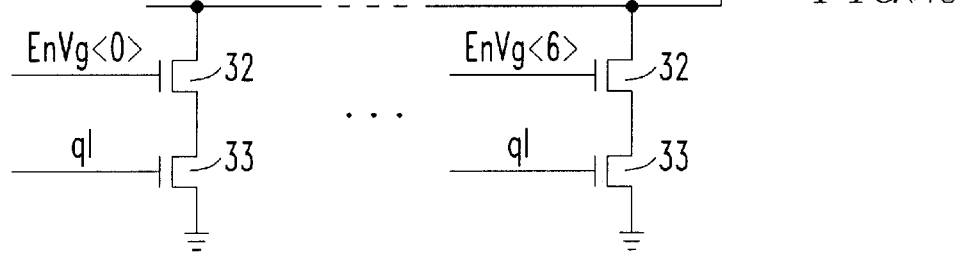

The data path 24 is comprised of a number of circuits for buffering and amplifying the data which are not shown as they do not form a part of the present invention. A plurality of output blocks 30 is arranged such that each output block 30 services one of the data pads 28. An example of a typical output block 30 is illustrated in FIG. 2. In FIG. 2, the output block 30 is comprised of a first plurality of enable transistors 31, each connected in series with a drive transistor 32. The transistors 31 each receive the data signal q, while each of the drive transistors receives one of the Vgate enable signal EnVg <0>, EnVg <1> . . . EnVg <6>. The output block is further comprised of a second plurality of enable transistors 33, each connected in series with a drive transistor 32. The first and second pluralities of enable transistors 31, 33, respectively, must be fully turned on by the signals q and ql for the drive transistors 32 to provide the proper pull-down load to the data pad 28 that it is servicing so that the voltage level necessary to represent the data being transferred is quickly reached. Each of the other output blocks 30 may be identically constructed, and each receives the data signals q and ql and Vgate enable signals EnVg <0> through <6>.

Each of the lines carrying the Vgate enable signals EnVg <0> through <6> is connected to a system voltage, $V_{DD}$, through a p-channel transistor 34. The gate of each of the transistors 34 is connected to a control circuit 36 through an inverter 38. The transistors 34 thus provide a plurality of switches which, under the control of control circuit 36, may momentarily connect the lines carrying the Vgate enable signals to the voltage source $V_{DD}$.

Completing the description of FIG. 1, a voltage regulator 40 provides the voltage for the Vgate enable signals through Vgate enable control 41. Vgate enable control 41 provides the Vgate enable signals to the output blocks 30 through a bus 42. The bus 42 is comprised of a plurality of lines each carrying one of the Vgate enable signals EnVg <0> through <6>.

Figure 3:
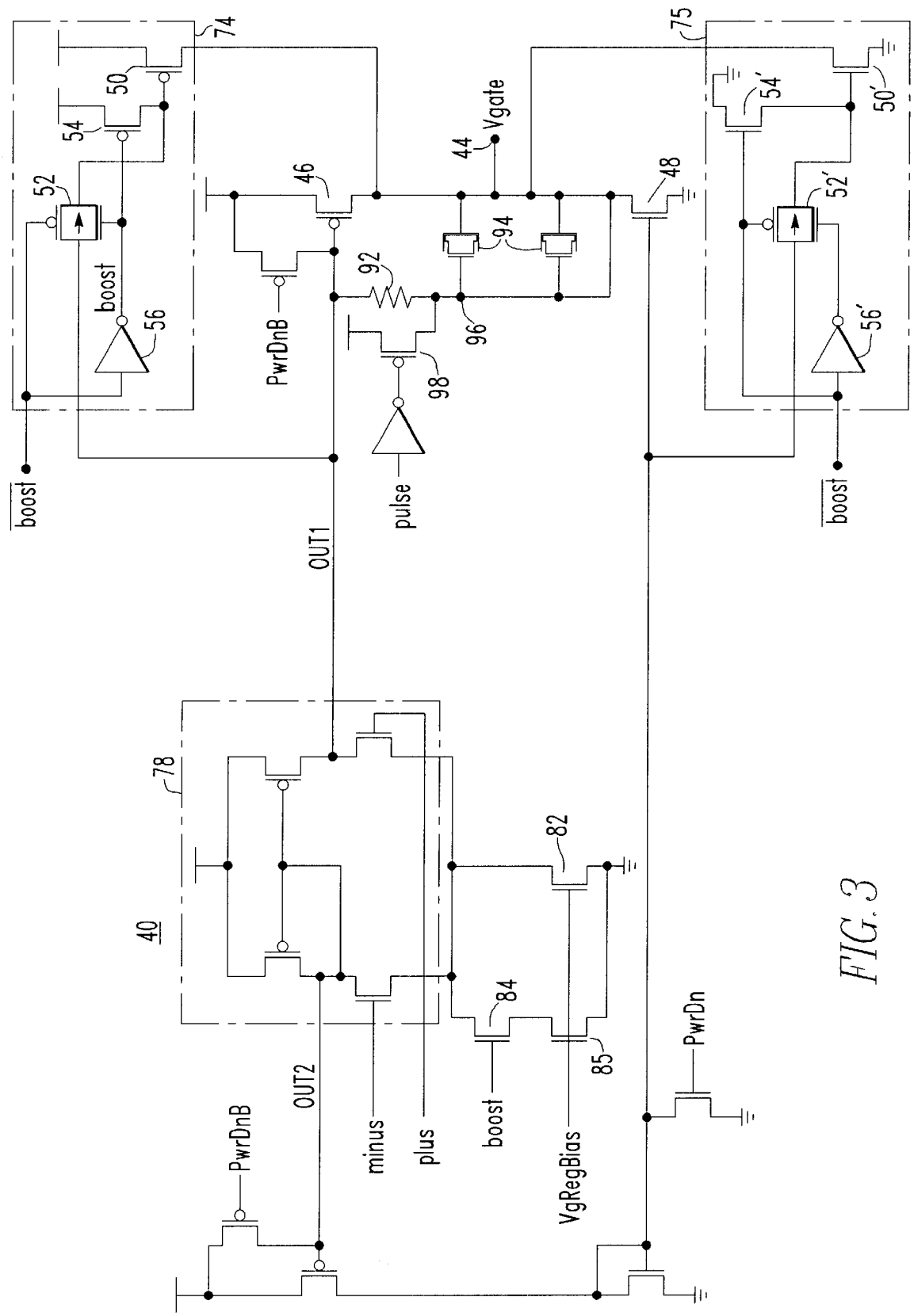
FIG. 3 is a circuit diagram illustrating one implementation of a voltage regulator constructed according to the teachings of the present invention.

Turning now to FIG. 3, a circuit diagram illustrating one implementation of the voltage a regulator 40 constructed according to the present invention is illustrated. The voltage regulator 40 has an output terminal 44. A p-channel transistor 46 is connected between a voltage source and the output terminal 44 and an n-channel transistor 48 is connected between the output terminal 44 and ground.

A transistor 50 receives at its gate terminal, through a pass gate 52, the same signal (OUT 1) that the transistor 46 receives. The pass gate 52 is operative in response to a boost signal produced by the control circuit 36. The boost signal is also input to a gate terminal of a p-channel transistor 54 through an inverter 56. The p-channel transistor 54 is connected across a gate terminal of the p-channel transistor 50 and a voltage source.

Figure 4:
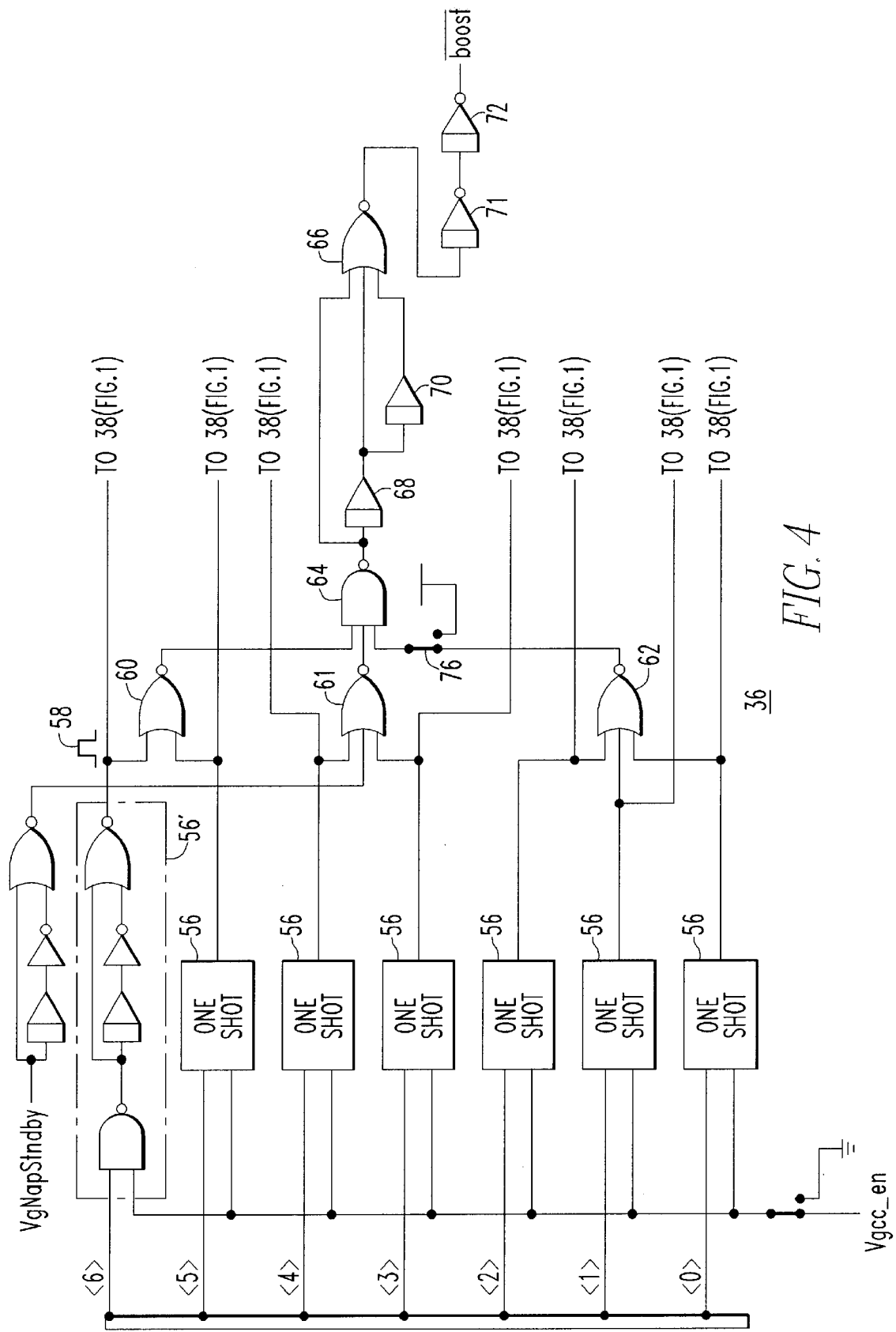
FIG. 4 is a circuit diagram of control circuit used in conjunction with the voltage regulator of FIG. 3.

In FIG. 4, a circuit diagram of a control circuit 36 which may be used in conjunction with the voltage regulator of FIG. 3 is illustrated. In FIG. 4, a plurality of one-shot multivibrators 56 is provided. Each of the one-shots is triggered if its corresponding Vgate enable signal is enabled through Vgate enable control 41. An exemplary embodiment for one of the one-shots 56 is illustrated at 56'. One-shot 56' receives a signal <6> indicative of the need to enable the Vgate enable signal EnVg <6>. When the signal <6> indicates the need to enable the signal EnVg <6>, and an enable signal V-GCC EN is present, the one-shot 56' produces an output pulse 58. The output pulse 58 is input to the transistor 34 through the inverter 38 shown in FIG. 1 to momentarily render the p-channel transistor 34 conductive. In that manner, the line carrying the signal EnVg <6> is momentarily connected to the voltage source $V_{DD}$, with the time of connection being determined by the width of the pulse 58. The other one-shots 56 are similarly constructed and used to momentarily connect the other lines carrying the Vgate enable signals to the voltage source $V_{DD}$.

NOR gates 60, 61 and 62 are used to aggregate the pulses produced by the one-shots 56. The outputs of the NOR gates are input to a first logic gate 64 which is a NAND gate. The output of the NAND gate 64 is connected to an input of a second gate which is a NOR gate 66. The output of the NAND gate 64 is also connected to a second input of the NOR gate 66 through a delay circuit 68. The output of the delay circuit 68 is connected to another input of the NOR gate 66 through a second delay circuit 70. The boost signal described above in conjunction with FIG. 3 is available at an output terminal of the NOR gate 66. That signal may be delayed further by propagating it through a pair of inverters 71 and 72.

The operation of the circuitry described thus far will now be explained. When the Vgate signal is loaded heavily as a result of various conditions (e.g. during switching of the EnVg lines), the Vgate level at output terminal 44 in FIG. 3 may not recover sufficiently quickly. Two steps are taken to boost the voltage. The first step is to render the p-channel transistor 34 servicing the relevant line carrying the Vgate enable signal which has just been enabled momentarily conductive through use of the pulse 58. That enables the individual line carrying the particular Vgate enable signal to be momentarily connected to the voltage source $V_{DD}$. Thus, the plurality of transistors 34 may be considered to be part of a booster circuit as their function is to momentarily boost the voltage available to the particular line carrying the Vgate enable signal which has just been enabled.

The second step which is taken is described in conjunction with FIG. 3. When the boost signal goes active low, pass gate 52 becomes conductive which renders transistor 50 conductive which gives the voltage regulator 40 much more pull-up capability. At the same time, transistor 54 is turned off. With the p-channel side of the regulator's output thus strengthened, the voltage regulator 40 has about a 20 millivolt higher Vgate regulation point. That helps Vgate hit its final value under heavy load conditions. Thus, the circuitry within the dotted box 74 may also be considered to be part of a booster circuit comprised of a transistor 50 with the remaining components comprising a control circuit for controlling the conductivity of transistor 50.

If only the p-channel side of the voltage regulator 40 is strengthened, somewhat of an offset is created because the p-channel side of the output has more current carrying capability than the n-channel side. That offset can be compensated by adding a booster circuit 75 which is similar to the circuit 74. In the booster circuit 75, the transistor 50 becomes an n-channel transistor 50'. The control portion of the booster circuit 75 is likewise changed as follows: the transistor 54 becomes an n-channel transistor 54'. The transistors 50' and 54' have their source and well connections to $V_{SS}$ and $V_{bb}$, respectively. The input to pass gate 52' is the same signal input to the gate of transistor 48. Transistor 54' receives the active low boost signal directly. The sizings of the various components comprising the booster circuit 75 would be such that the offset would be nulled out.

In summary, when selected Vgate enable signals are initially enabled, the booster circuit comprised of the plurality of transistors 34 is rendered operative so that one, some or all of the transistors 34 are rendered conductive to momentarily connect the line(s) carrying the Vgate enable signal(s) to a voltage source. The boost signal, produced under heavy load conditions, enables the output terminal 44 of the voltage regulator 40 to be sourced with additional current through booster circuit 74 in an unbalanced mode, or through booster circuits 74 and 75 in a balanced mode.

Production of the boost signal will now be described in conjunction with FIG. 4. In FIG. 4, the NAND gate 64 produces a control pulse whenever it receives a low going pulse at one or more of its input terminals. The NAND gate 64 will produce a control pulse whenever selected Vgate enable signals are initially enabled. Optionally, the lowest three lines, lines 2, 1 and 0 can be optioned out by a switch 76 because the capacitance on those lines is so small that Vgate is not affected much when they turn on. Obviously, the selection of other types of gates and other arrangements of gates could cause the control pulse to be produced under different conditions.

It has been found that the control pulse produced by the NAND gate 64 is not of sufficient duration. As a result, the control pulse is input directly to the second gate 66 to cause the gate 66 to change states to a low state. The control pulse is also input to the gate 66 through the delay circuit 68. In that manner, as the control pulse from gate 64 prepares to end, a delayed control pulse produced by delay circuit 68 becomes available at an input terminal of the gate 66, thereby insuring that the output of the gate 66 does not change state. In a similar manner, the delayed control pulse produced by the delay circuit 68 is input to the second gate 66 through the delay circuit 70 such that when the delayed control pulse produced by the delay circuit 68 is preparing to end, the delayed control pulse produced by the delay circuit 70 is input to an input terminal of the gate 66 thereby insuring that the output of the gate 66 does not change when the delay pulse produced by the delay circuit 68 ends. By chaining together a plurality of delay circuits 68 and 70, and producing a plurality of delayed control pulses, a control pulse of extended duration can be obtained at the output of the second gate 66. Additional delay circuits 68, 70 can be added to increase the length of the control pulse of extended duration. The control pulse of extended duration is the boost signal which is input to the control portion of the booster circuit 74.

The delay circuits 68 and 70 together with the NOR gate 66 may be viewed as a pulse extender. To insure glitch-free operation, the pulse extender of the present invention should have outputs taken from enough points along the delay line to insure no glitch in the extended pulse.

Returning to FIG. 3, the voltage regulator 40 may have a differential amplifier 78 which produces a first output signal, OUT 1, for directly driving transistor 46 and a second output signal, OUT 2, which indirectly drives transistor 48. A bias voltage is supplied to the differential amplifier 78 through an n-channel transistor 82. Transistor 82 is responsive to a control signal VgRegBias. A transistor 84 is connected in series with a transistor 85, with the two transistors 84 and 85 connected in parallel with the transistor 82. The boost signal may be additionally used to control the transistor 84. Because the boost signal is active low, an active high version is taken from the output of inverter 56, such that when the boost signal is active, the transistor 84 is turned on.

Figure 5:
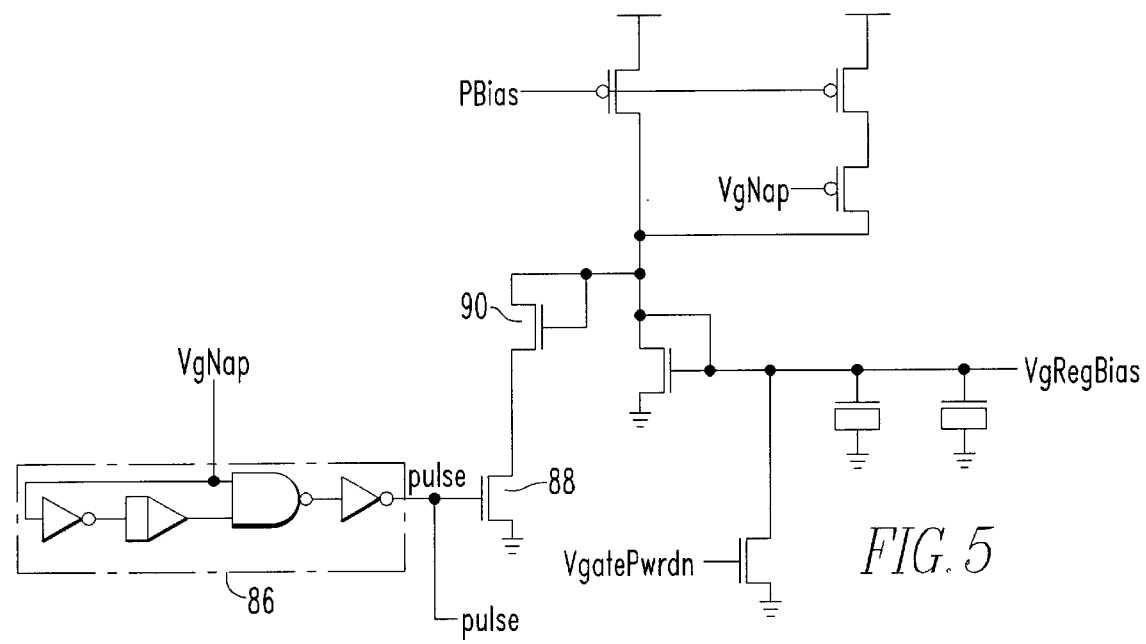
FIG. 5 is a circuit diagram of a circuit for controlling the decrease in bias voltage supplied to the differential amplifier of FIG. 3.

When going into nap or standby modes, the voltage regulator needs to go to a low power mode very quickly. It has been determined that the steps currently taken to reduce the bias voltage, by decreasing the control signal VgRegBias, are insufficient. As shown in FIG. 5, a one-shot 86 is responsive to a signal VgNap which is responsible for putting the voltage regulator 40 into a nap or standby mode. The one-shot 86 produces an output pulse which temporarily renders transistor 88 conductive. When the transistor 88 is conductive, a transistor 90, connected to operate as a diode, pulls the signal VgRegBias within a Vt of ground thereby causing it to decrease even more rapidly. When the single pulse produced by the one-shot 86 is no longer available, the diode 90 is no longer conductive as the transistor 88 is turned off. In that manner the reduction in bias voltage can be increased.

It has been determined that even if the voltage reduction of the signal VgRegBias occurs sufficiently quickly, a compensation resistor 92 and compensation capacitor 94, which are a load across the transistor 46, can keep the p-channel transistor 46 from reducing its drive sufficiently quickly. The pulse produced by the one-shot 86 of FIG. 5 is used to pull a node 96 between the resistor 92 and capacitor 94 to a predefined voltage other than zero through a transistor 98. In the embodiment shown in FIG. 3, the predefined voltage is $V_{DD}$ which allows transistor 46 to go to a low power mode very quickly. This actually shuts off the transistor 46 briefly, but because that shutoff occurs at the beginning of a nap or standby mode, the shutoff is a non-issue. To avoid that brief shutoff, instead of pulling the node 96 up to $V_{DD}$, the node 96 could be pulled up to a large p-channel diode tied to $V_{DD}$. The p-channel diode must be sized such that it allows quick pullup while leaving transistor 46 on near steady state nap or standby conditions. That embodiment comes at a layout expense as the p-channel diode needs to be sufficiently large.

Figure 6:
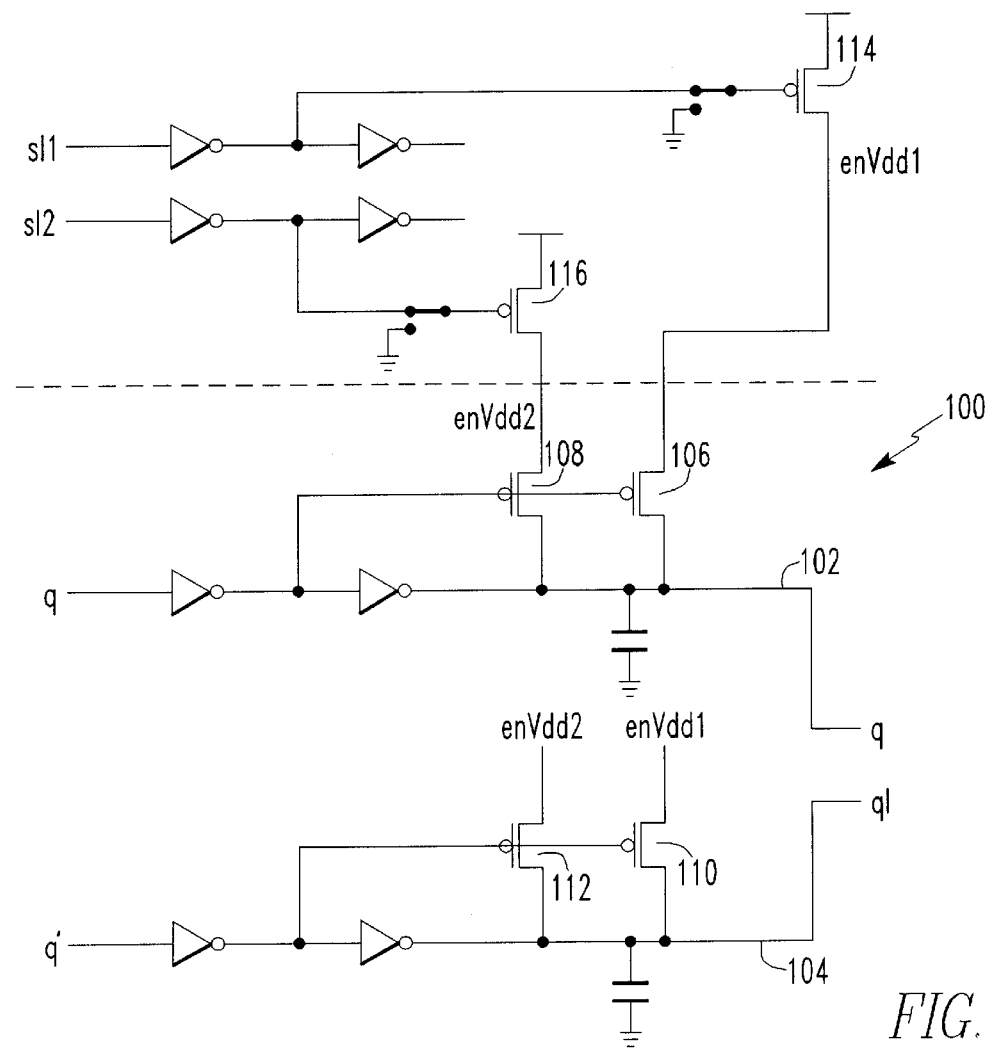

Illustrated in FIG. 6 is an output pre-driver circuit 100. The pre-driver circuit 100 is constructed of a first data path 102 responsive to a data signal Q and a second data path 104 responsive to a delayed version of the data signal Q'. The first data path 102 has two output transistor drive stages 106 and 108 while the second data path 104 similarly has two transistor output drive stages 110 and 112. The transistors 106 and 110 are enabled when a signal s11 renders a transistor 114 conductive. The transistors 108 and 112 are operative when a signal s12 renders a transistor 116 conductive.

It is known in the art to monitor the strength of the p-channel and n-channel transistors in an output drive device (not shown) and to generate a two-bit signal where s11 and s12 represent the two bits of the binary signal. The implementation of the output pre-driver 100 in FIG. 6 allows the p-channel device 106 to be rendered conductive independently of the p-channel device 108. The p-channel device 110 can be enabled independently of the p-channel transistor 112. As a result, all four transistors 106, 108, 110 and 112 may be on, transistors 106 and 110 may be on while transistors 108 and 112 may be off, and transistors 108 and 112 may be on while transistors 106 and 110 are off. With the arrangement shown in FIG. 6, three of the four two-bit codes can have different total amounts of p-channel drive enabled in the pre-driver 100. With proper tuning, more skew can be eliminated from the subsequent output driver stages with the pre-driver 100 illustrated in FIG. 6.

Figure 7:
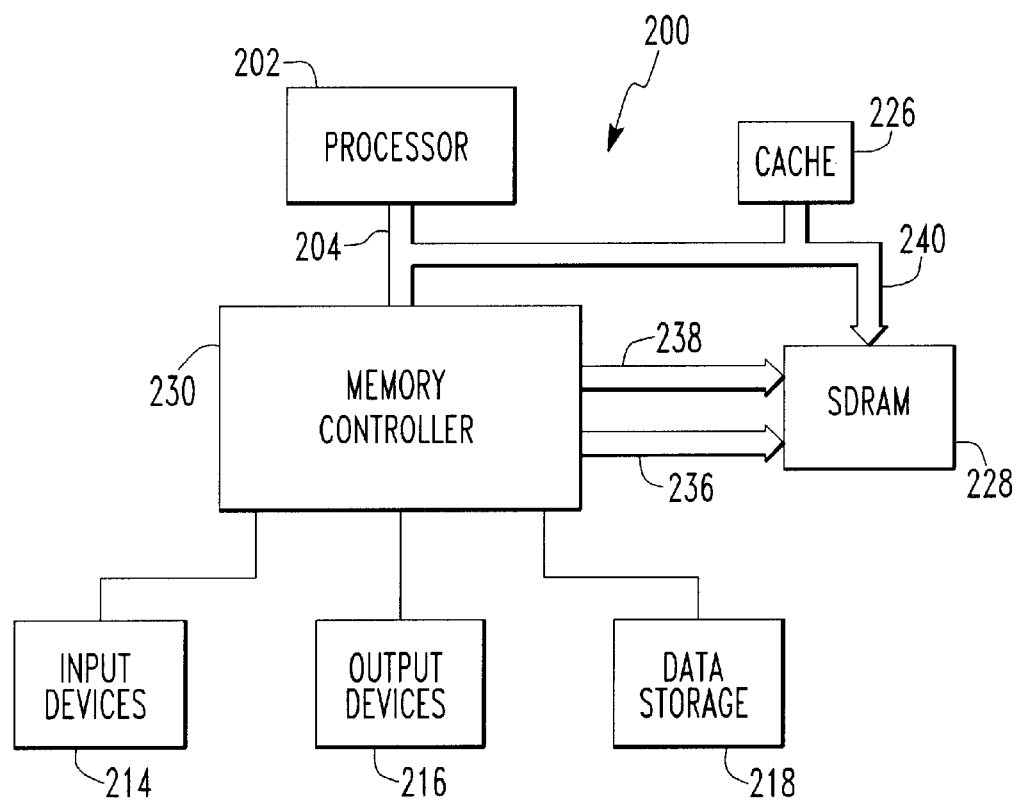
FIG. 7 is a block diagram of a computer system in which the memory device of FIG. 1 may be used.

FIG. 7 illustrates a computer system 200 containing the memory of FIG. 1. The computer system 200 includes a processor 202 for performing various computing functions, such as executing specific software to perform specific calculations or tasks. The processor 202 includes a processor bus 204 that normally includes an address bus, a control bus, and a data bus. In addition, the computer system 200 includes one or more input devices 214, such as a keyboard or a mouse, coupled to the processor 202 to allow an operator to interface with the computer system 200. Typically, the computer system 200 also includes one or more output devices 216 coupled to the processor 202, such output devices typically being a printer or a video terminal. One or more data storage devices 218 are also typically coupled to the processor 202 to allow the processor 202 to store data in or retrieve data from internal or external storage media (not shown). Examples of typical storage devices 218 include hard and floppy disks, tape cassettes, and compact disk read-only memories (CD-ROMs). The processor 202 is also typically coupled to cache memory 226, which is usually static random access memory ("SRAM") and to an SDRAM 228 through a memory controller 230. The memory controller 230 normally includes a control bus 236 and an address bus 238 that may be coupled to the SDRAM 228. A data bus 240 may be coupled to the processor bus 204 either directly (as shown), through the memory controller 230, or by some other means.

While the present invention has been described in conjunction with preferred embodiments thereof, those of ordinary skill in the art will recognize that many modifications and variations may be made. The foregoing description and the following claims are intended to cover all such modifications and variations.

What is claimed is:

1. A method of providing variable output drive capability, comprising:
    generating a two-bit signal representative of the relative strength of the n-channel and p-channel transistors in an output device; and
    controlling with a plurality of switches the number of output pre-driver stages that are active in response to said two-bit signal.

2. A method, comprising:
    generating a signal representative of the relative strength of the n-channel and p-channel transistors in an output device;
    enabling with a plurality of switches certain output stages in a pre-driver in response to said signal; and
    inputting a high and a low data signal to the output device through the pre-driver.

3. The method of claim 2 wherein said enabling step reduces skew in the data output by the output device.

4. A pre-driver providing variable output drive capability, comprising:
   a plurality of pre-driver output transistors; and
   a plurality of switches for controlling the number of said plurality of pre-driver output transistors that are active in response to signals indicative of the strength of the output transistors in an output device.

5. A portion of a data path, comprising:
   an output driver responsive to a data signal; and
   a pre-driver providing variable output drive capability, comprising:
      a plurality of pre-driver output transistors; and
      a plurality of switches for controlling the number of said plurality of pre-driver output transistors that are active in response to signals indicative of the strength of output transistors in said output driver, said pre-driver for providing said data signal to said output driver.

6. A memory device, comprising:
   a plurality of memory cells arranged in an array of rows and columns;
   a plurality of devices for identifying cells within said array;
   a plurality of pads;
   a data path connecting said plurality of pads and said array, said data path including
      an output driver responsive to a data signal; and
      a pre-driver providing variable output drive capability, comprising:
         a plurality of pre-driver output transistors; and
         a plurality of switches for controlling the number of said plurality of pre-driver output transistors that are active in response to signals indicative of the strength of output transistors in said output driver, said pre-driver for providing said data signal to said output driver.

7. A computer system, comprising:
   a processor having a processor bus;
   an input device coupled to the processor through the processor bus;
   an output device coupled to the processor through the processor bus;
   a memory device coupled to the processor bus, the memory device comprising:
      a plurality of memory cells arranged in an array of rows and columns;
      a plurality of devices for identifying cells within said array;
      a plurality of pads;
      a data path connecting said plurality of pads and said array, said data path including:
         an output driver responsive to a data signal; and
         a pre-driver providing variable output drive capability, comprising:
            a plurality of pre-driver output transistors; and
            a plurality of switches for controlling the number of said plurality of pre-driver output transistors that are active in response to signals indicative of the strength of output transistors in said output driver, said pre-driver for providing said data signal to said output driver.

8. The method of claim 1 wherein said controlling is further in response to the relative size of said output pre-driver stages.

9. The method of claim 2 wherein said enabling is further in response to the relative size of said output stages.

10. The pre-driver of claim 4 wherein at least one of said plurality of pre-driver output transistors is sized differently relative to another of said plurality of pre-driver output transistors.

11. The portion of a data path of claim 5 wherein at least one of said plurality of pre-driver output transistors of said pre-driver is sized differently relative to another of said plurality of pre-driver output transistors of said pre-driver.

12. The memory device of claim 6 wherein at least one of said plurality of pre-driver output transistors within said data path is sized differently relative to another of said plurality of pre-driver output transistors within said data path.

13. The computer system of claim 7 wherein at least one of said plurality of pre-driver output transistors within said data path is sized differently relative to another of said plurality of pre-driver output transistors within said data path.

* * * * *

UNITED STATES PATENT AND TRADEMARK OFFICE
CERTIFICATE OF CORRECTION

PATENT NO. : 6,466,485 B2  
DATED : October 15, 2002  
INVENTOR(S) : Huber

It is certified that error appears in the above-identified patent and that said Letters Patent is hereby corrected as shown below:

Column 4,
Line 66, delete "a".

Column 5,
Line 23, delete "V-GCC EN" and substitute therefore -- V-GCC_EN --.

Signed and Sealed this

Fifth Day of October, 2004

JON W. DUDAS
*Director of the United States Patent and Trademark Office*